United States Patent [19]

Watanabe et al.

[11] Patent Number: 4,691,376
[45] Date of Patent: Sep. 1, 1987

[54] FREQUENCY CONVERTER

[75] Inventors: Hiroshi Watanabe, Gyoda; Takashi Johzuka, Sakado; Masanobu Suzuki, Nagareyama, all of Japan

[73] Assignee: New Japan Radio Co., Ltd., Tokyo, Japan

[21] Appl. No.: 806,863

[22] Filed: Dec. 9, 1985

[30] Foreign Application Priority Data

Dec. 8, 1984 [JP] Japan .................................. 59-259733

[51] Int. Cl.$^4$ .................................................. H04B 1/26
[52] U.S. Cl. ...................................... 455/131; 455/327; 455/301
[58] Field of Search ............... 455/12, 131, 314, 315, 455/316, 325, 327, 301; 358/188

[56] References Cited

U.S. PATENT DOCUMENTS 4,429,418 1/1984 Hooper .............................. 455/316

OTHER PUBLICATIONS

"A Low Cost Integrated LNA/Down Converter for the 4GHz Downlink Satellite Band", By Mercer et al., 1981.

Primary Examiner—Jin F. Ng
Attorney, Agent, or Firm—Armstrong, Nikaido, Marmelstein & Kubovcik

[57] ABSTRACT

A frequency converter for use in a 4 GHz-band comprising a printed circuit board and a shield case. The printed circuit board is provided in the shield case and composed of an input terminal, and successively, a circuit of low noise amplifier, a band pass filter, a mixer and a circuit of local oscillator connected to the mixer. The constitution of the frequency converter is simplified, and accordingly the mass productivity, yield of production and reliability of the fabricated converter are greatly improved.

4 Claims, 5 Drawing Figures

FREQUENCY CONVERTER

BACKGROUND OF THE INVENTION

The present invention relates to a frequency converter utilized as a receiver for television satellite broadcasting.

A frequency converter for the above-mentioned use is generally constituted as shown in FIG. 5, wherein numeral 1 is a high-frequency input terminal connected to an antenna, and the like, numeral 2 is a low-noise amplifier to amplify an input signal from the input terminal 1 up to a prescribed level, numeral 3 is a band pass filter (referred as BPF hereinafter) to pass only a signal within a prescribed frequency band, numeral 4 is a local oscillator and numeral 5 is a mixer to mix a frequency signal from the BPF 3 and a frequency signal from the local oscillator 4 so as to make a diferential frequency signal (beat frequency signal) between them. Numeral 6 is an output terminal to supply an intermediate frequency signal from the mixer 5 to an amplifier of the next stage.

Hitherto, in the case of utilizing a frequency band of 4 GHz, the above-mentioned frequency converter has been fabricated as a plurality of circuit boards one of which corresponds to each of the above circuits (blocks), wherein the boards are isolated from one another by a metalic shield box, or the like, and connected to each other. The reason why the circuits are not fabricated on a common (single) board might be considered as follows: In a 4 GHz frequency band, the dimension of a board becomes larger than that in the case of 12 GHz. In assembling the common boards compactly, there have been problems in interference between the circuits. This also results from the fact that the frequency converter is a device wherein the latest microwave technology is widely employed, that is to say, a high stabilized oscillator, a super low-noise amplifier, and the like are included in the frequency converter. However, when the circuit is fabricated individually or separately, the whole construction of the circuit becomes complicated, whereby it is difficult to realize a satisfactory mass productivity, a good yield of production or a good reliability of the fabricated converter.

It is an object of the invention to provide a circuit for frequency conversion wherein each of the circuits is built-in onto a single board on which a shielding means between the circuits is not provided, thereby a mass productivity, yield of production and reliability of the fabricated frequency converter are greatly improved.

This and other objects of the invention will become apparent from the description hereinafter.

SUMMARY OF THE INVENTION

The present invention relates to a frequency converter used in a 4 GHz-band, wherein a chain of an input terminal, that is to say, a low noise amplifier, a band pass filter, a mixer and a local oscillator is formed on a single printed curcuit board, and the whole of which is packed in a shield case.

DETAILED DESCRIPTION

Figure 1:
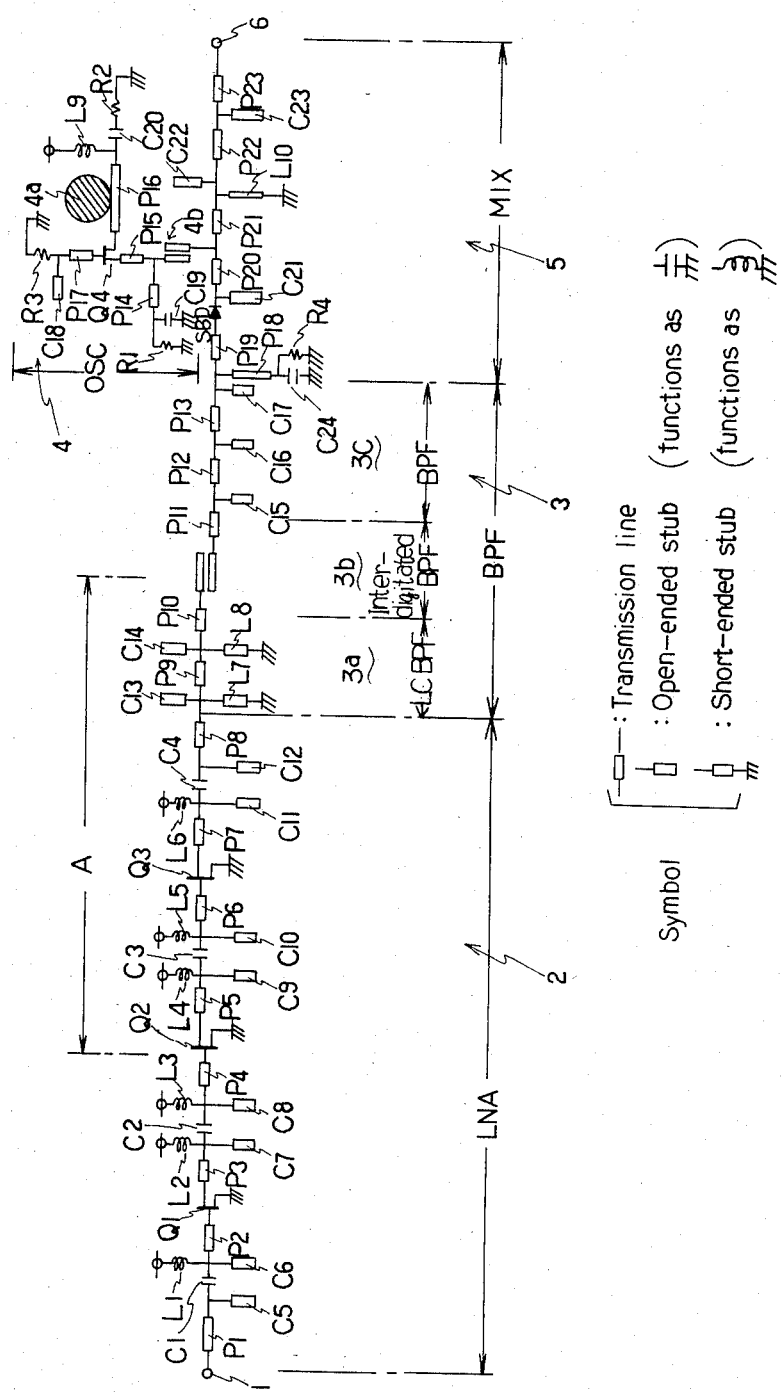
FIG. 1 is a circuit diagram of an embodiment of a frequency converter of the present invention.
Figure 2:
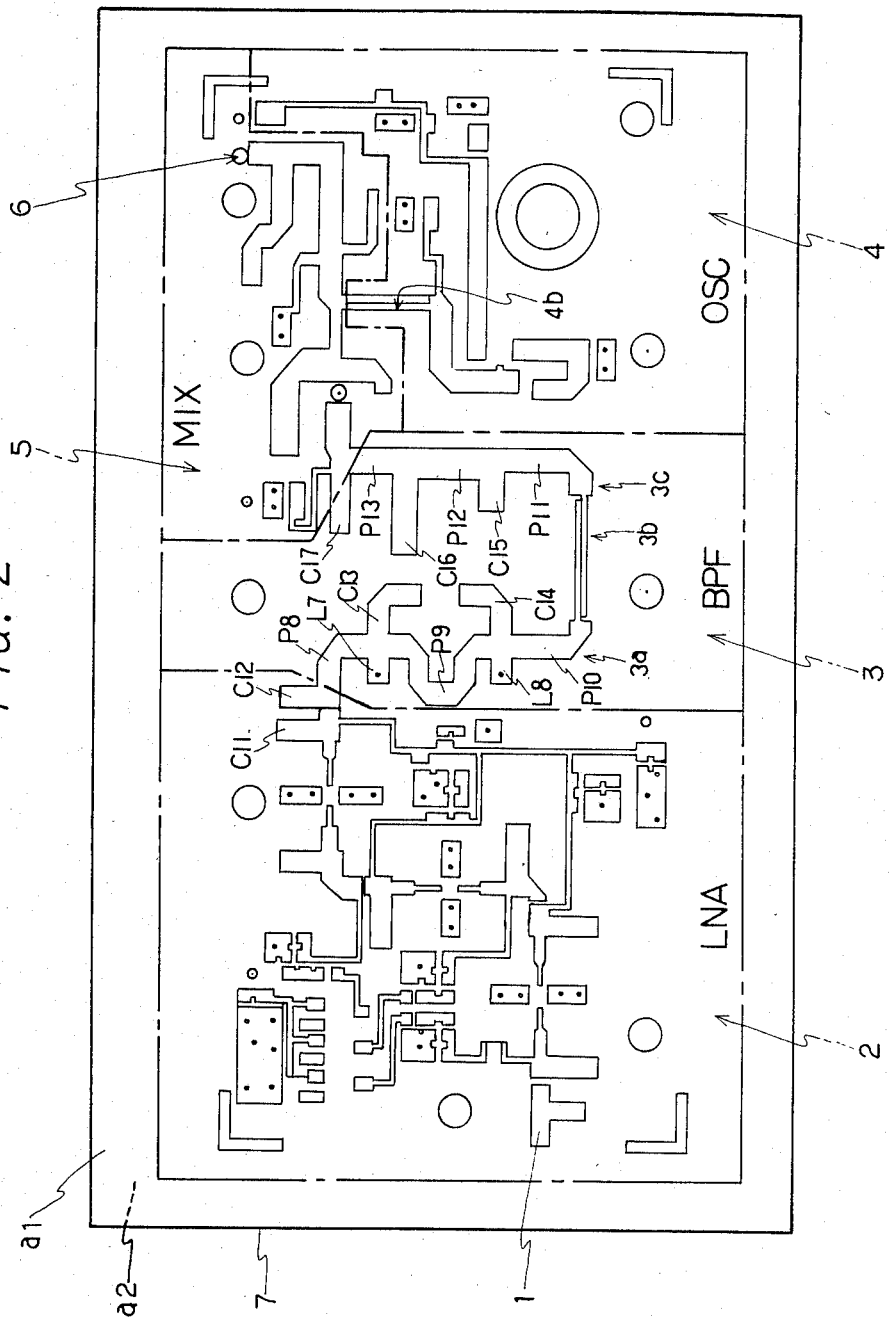
FIG. 2 is a top view of a printed circuit board illustrating the circuit shown in FIG. 1.

FIG. 1 is a whole circuit of an embodiment of the present invention, wherein an input frequency of 3.7 to 4.2 GHz (a band of 4 GHz) is converted to a frequency of 950 (940) to 1450 (1440) MHz. FIG. 2 illustrates a top surface of a printed circuit board 7 which is an actual circuit pattern of the whole equivalent circuit shown in FIG. 1.

A low noise amplifier 2 is composed of three stages each of which includes an FET (field effect transistor ) Q1, Q2 and Q3, respectively. C1 to C4 are coupling capacitors, C5 to C12 are open-ended stubs used equivalently to shunt capacitors, L1 to L6 are chokes for supplying bias, and P1 to P8 are transmission lines. A "stub" is a portion of pattern extending sideways from the transmission line, whereby it functions as a shunt capacitance or inductance in accordance with the electrical length thereof.

Numeral 3 is a BPF composed of a LC BPF portion 3a having a passing center frequency of 3.95 GHz, an interdigitated BPF portion 36 having a passing center frequency of 3.95 GHz and a band rejection filter 3C having a rejection-center frequency of 6.35 GHz. The filters 3a, 3b and 3c are connected in series. C12 to C17 are open-ended stubs, L7 to L8 are short-ended stubs, and P9 to P13 are transmission lines.

Numeral 4 is a local oscillator which is composed of a stabilized oscillator utilizing an FET Q4 and a dielectric resonator 4a, and is coupled to a mixer 5 through an interdigitated BPF 4b having a passing center frequency of 5.15 (5.14) GHz. P14 to P17 are transmission lines, C18 is an open-ended stub, L9 is a choke for supplying bias, C19 and C20 are capacitors, and R1 to R3 are resistors.

Numeral 5 is a mixer wherein a Schottky barrier diode (SBD) is used as a mixing diode. P18 is a line for DC return of SBD, P19 to P23 are transmission lines, C21 to C23 are open-ended stubs, L10 is a short-ended stub, C24 is a capacitor and R4 is a resistor.

A printed circuit comprising the above-mentioned transmission lines, open-ended stubs, short-ended stubs, and the like is formed on the surface a1 of a printed circuit board 7 shown in FIG. 2. On the reverse side a2 of the printed circuit 7, a conducting foil (not shown) is formed on the whole face as a ground.

For the realization of a ground plane on the surface a1, the connection between the surface a1 and the reverse side a2 of the board is carried out by a through hole shown as a black dot (·) in FIG. 2.

On the printed circuit board 7, printed circuits of the low noise amplifier 2, BPF 3, local oscillator 4 and mixer 5 are formed in good order along with the signal flow (without overlapping one another).

In the instant embodiment, prevention of interference between circuits and stabilization of the local oscillator 4 are effectively realized by particulary constituting a circuit pattern of the BPF 3 as described hereinafter. The above prevention and stabilization are further developed by disposing a microwave absorber as described hereinafter.

The constitution of the BPF 3 is as follows: The LC BPF 3a and band rejection filter 3c are arranged to face each other, and the interdigitated BPF 3b is lain between the end of the filter 3a and the end of the filter 3c, wherein both of the ends are located at the same sides of the filters. That is to say, the filters 3a to 3c are arranged to be approximately U-shaped, and open-ended stubs C13 and C14 of the LC BPF 3a are arranged to face the open-ended stubs C15 and C16 of the band rejection filter 3c, respectively.

This construction is superior in signal radiation to conventional BPF (e.g. side couple BPF) and makes each circuit (low noise amplifier, mixer, local oscillator) independent, whereby the trimming or tuning can be done easily and independently.

Figure 3:
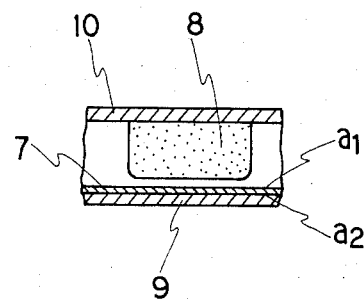
FIG. 3 is a sectional view of a printed circuit board in the present invention wherein a microwave absorber is provided.

FIG. 3 illustrates a microwave absorber placed above the printed circuit board 7. In FIG. 3, the printed circuit board 7 is fixed to the bottom of the shield case 9 by screws, and the like. The shield case 9 is covered with a shield cover 10. The space between the inner surface of the shield cover 10 and the top surface of the printed circuit board 7 is about 11 mm. The microwave absorber 8 is about 9 mm in thickness and adheres to the inner surface of the shield cover 10. The portion of the printed circuit over which the microwave absorber 8 is provided corresponds to a part A of FIG. 1. The part A is composed of members from FET Q2 of the low noise amplifier 2 to the interdegitated BPF 3b of the BPF 3.

Figure 4:
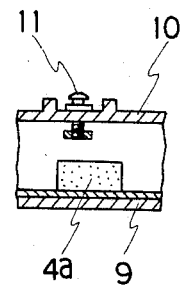
FIG. 4 is a sectional view of a local oscillator in the present invention wherein a member for adjusting frequency is provided.
Figure 5:
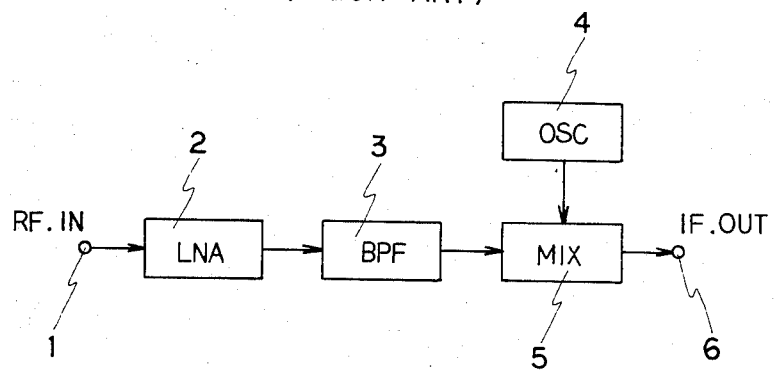
FIG. 5 is a circuit diagram of a conventional frequency converter.

FIG. 4 illustrates an adjusting portion of a local frequency in the local oscillator 4. Numeral 11 is an adjusting screw provided on the shield cover 10 just over the dielectric resonator 4a.

According to the present invention, a frequency converter for use in a band of 4 GHz is composed of a single circuit board. Thus, the construction is simplified, and mass productivity, yield of production and reliability of the fabricated converter are greatly improved. In the circuit of the frequency converter, the pattern of the BPF is arranged in U-shape so that the board can be made small in size and the mutual interference between the circuits can be effectively prevented, while the local oscillator can be highly stabilized.

What we claim is:

1. A frequency converter for use in a 4 GHz band comprising:
   a printed circuit board provided in a shield case having at a first end an input terminal and at a second end an output terminal;
   a printed circuit formed longitudinally on said board comprising, connected in sequence, a low noise amplifier connected to said input terminal, a band pass filter, and a mixer having connected thereto a local oscillator, said mixer being connected to said output terminal;
   said band pass filter being formed of three portions on said printed circuit board substantially centrally thereon, comprising a first LC band pass portion formed transversely on said board, a second interdigitated band pass portion formed longitudinally on said board, and a third band rejection portion formed transversely on said board, said first, second and third portions being connected to each other in series in the direction of signal flow to form said band pass filter in a U-shape.

2. A frequency converter as recited in claim 1, wherein said first and third filter portions include open-ended stubs functioning as capacitance, said open ended stubs of said first and third portions being arranged to face each other toward the center of said U-shaped band pass filter.

3. A frequency converter as recited in claim 1, wherein said shield case is provided with a shield cover having an inner surface, and a microwave absorber is fixed on the inner surface of said shield cover to extend over a portion of said printed circuit.

4. A frequency converter as recited in claim 3 wherein said microwave absorber extends over said low noise amplifier and said first and second portions of said band pass filter.

* * * * *